United States Patent
Tu et al.

(10) Patent No.: US 8,455,160 B2
(45) Date of Patent: Jun. 4, 2013

(54) COLOR FILTER OF LIQUID CRYSTAL ON SILICON DISPLAY DEVICE

(75) Inventors: Ho Tu, Sinshih Township, Tainan County (TW); Yi-Hua Wang, Sinshih Township, Tainan County (TW)

(73) Assignee: Himax Technologies Limited, Sinshih Township, Tainan County (TW)

( * ) Notice: Subject to any disclaimer, the term of this patent is extended or adjusted under 35 U.S.C. 154(b) by 333 days.

(21) Appl. No.: 12/963,972

(22) Filed: Dec. 9, 2010

(65) Prior Publication Data

US 2012/0148946 A1 Jun. 14, 2012

(51) Int. Cl.
*G02F 1/1335* (2006.01)
(52) U.S. Cl.
USPC ................................ 430/7; 349/106; 349/113
(58) Field of Classification Search
None
See application file for complete search history.

(56) References Cited

U.S. PATENT DOCUMENTS

2006/0290830 A1* 12/2006 Teramoto et al. ............... 349/56
2009/0213315 A1* 8/2009 Wang ............................ 349/123

FOREIGN PATENT DOCUMENTS

JP 8-286178 A * 11/1996

OTHER PUBLICATIONS

Computer-generated translation of JP '8-286178 (Nov. 1996).*

* cited by examiner

*Primary Examiner* — John A. McPherson
(74) *Attorney, Agent, or Firm* — McClure, Qualey & Rodack, LLP (57) ABSTRACT

A color filter of a liquid crystal on silicon (LCOS) display device is disclosed, including a substrate including a plurality of pixel regions wherein each pixel region includes a first color dot, a second color dot and a third color dot; and a first color resist, a second color resist and a third color resist disposed in the first color dot, the second color dot and the third color dot on the substrate, wherein each of the first color resist, the second color resist and the third color resist includes at least one opening.

15 Claims, 11 Drawing Sheets

COLOR FILTER OF LIQUID CRYSTAL ON SILICON DISPLAY DEVICE

BACKGROUND OF THE INVENTION

1. Field of the Invention

The invention relates in general to a liquid crystal on silicon (LCOS) display device and more particularly to a color filter of a liquid crystal on silicon (LCOS) display device.

2. Description of the Related Art

As technology develops, electronic devices with display panels are widely applied in many fields. Important features that a customer especially looks for in an electronic device include color quality and resolution of the display panel attached thereto. Among different types of display panels, a liquid crystal on silicon (LCOS) display panel has good resolution and therefore is commonly used in many kinds of electronic devices.

Liquid crystal on silicon (LCOS) is a "micro-projection" or "micro-display" technology typically applied in projection apparatuses. It is a reflective technology similar to DLP projectors; however, it uses liquid crystals instead of individual mirrors. By way of comparison, LCD projectors use transmissive LCD chips, allowing light to pass through the liquid crystal. In LCOS, liquid crystals are applied directly to the surface of a silicon chip coated with an aluminized layer, with some type of passivation layer, which is highly reflective.

LCOS technology can typically produce higher resolution and higher contrast images than standard liquid crystal display and plasma display technologies, which makes it less expensive to implement in such devices as televisions.

In order to display colorful images, an LCOS display device usually includes a color filter layer disposed on the side of a silicon substrate. The color filter layer is between the alignment layer and the silicon substrate and includes color dots of different colors for displaying all kinds of colors. However, given conventional technology, transmittance of LCOS display devices is not fully maximized. A new LCOS display device which has high transmittance and meets national television standard committee (NTSC) specifications is required.

BRIEF SUMMARY OF INVENTION

The invention provides a color filter of a liquid crystal on silicon (LCOS) display device, comprising a substrate comprising a plurality of pixel regions wherein each pixel region comprises a first color dot, a second color dot and a third color dot and a first color resist, a second color resist and a third color resist disposed in the first color dot, the second color dot and the third color dot on the substrate, wherein each of the first color resist, the second color resist and the third color resist comprises at least one opening.

The invention provides a method for forming a color filter of a liquid crystal on silicon (LCOS) display device, comprising providing a substrate, forming a first color resist on the substrate, patterning the first color resist to form a first color dot, wherein the first color resist comprises an opening in the first color dot, forming a second color resist on the substrate and the first color resist, patterning the second color resist to form a second color dot, wherein the second color resist comprises an opening in the second color dot, forming a third color resist on the substrate and the first and the second color resists, and patterning the third color resist to form a third color dot, wherein the third color resist comprises an opening in the third color dot.

BRIEF DESCRIPTION OF DRAWINGS

The invention can be more fully understood by reading the subsequent detailed description and examples with references made to the accompanying drawings, wherein.

DETAILED DESCRIPTION OF INVENTION

It is understood that specific embodiments are provided as examples to teach the broader inventive concept, and one of ordinary skill in the art can easily apply the teaching of the present disclosure to other methods or apparatus. In addition, it is understood that the methods and device discussed in the present disclosure include some conventional structures and/or processes. Since these structures and processes are well known in the art, they will only be discussed in a general level of detail. Furthermore, reference numbers are repeated throughout the drawings for sake of convenience and example, and such repetition does not indicate any required combination of features or steps throughout the drawings. Moreover, the formation of a first feature over and on a second feature in the description that follows may include embodiments in which the first and second features are formed in direct contact, and may also include embodiments in which additional features may be formed interposing the first and second features, such that the first and second features may not be in direct contact.

Figure 1A:
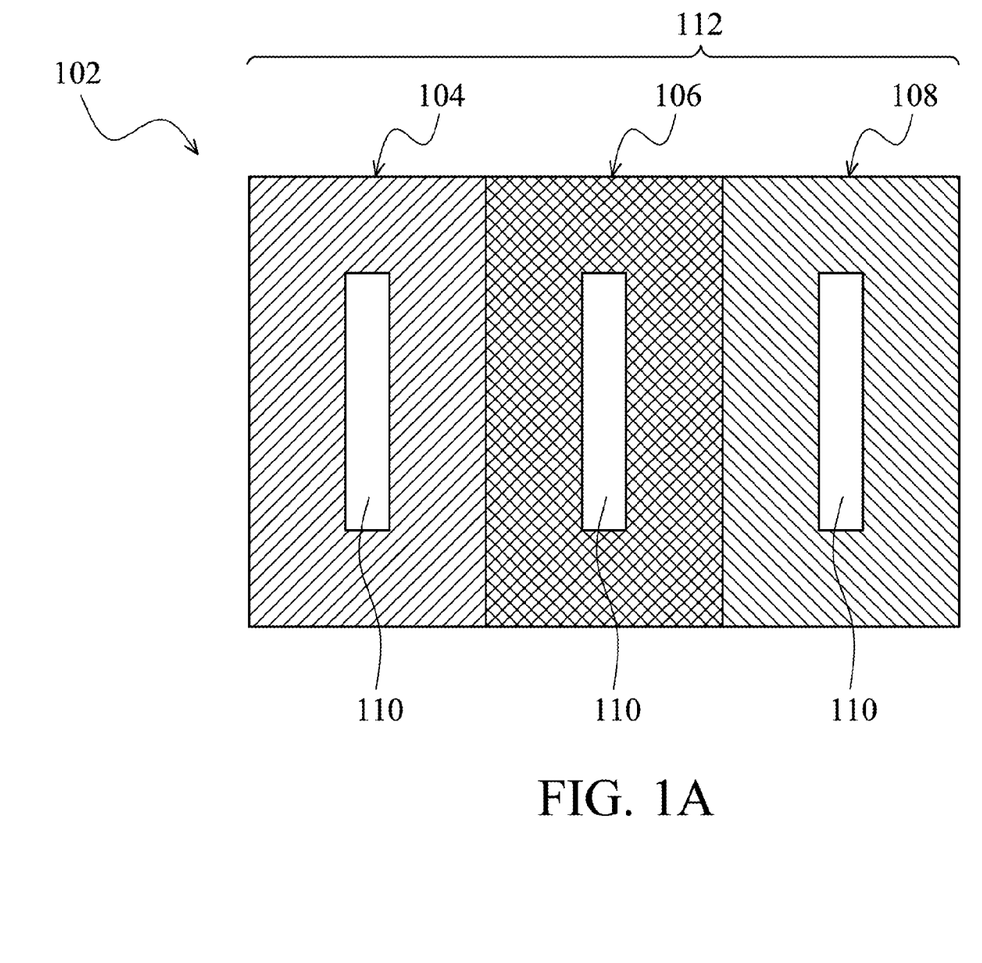
FIG. 1A shows a plan view of a color filter of a liquid crystal on silicon (LCOS) display device of an embodiment of the invention.
Figure 1B:
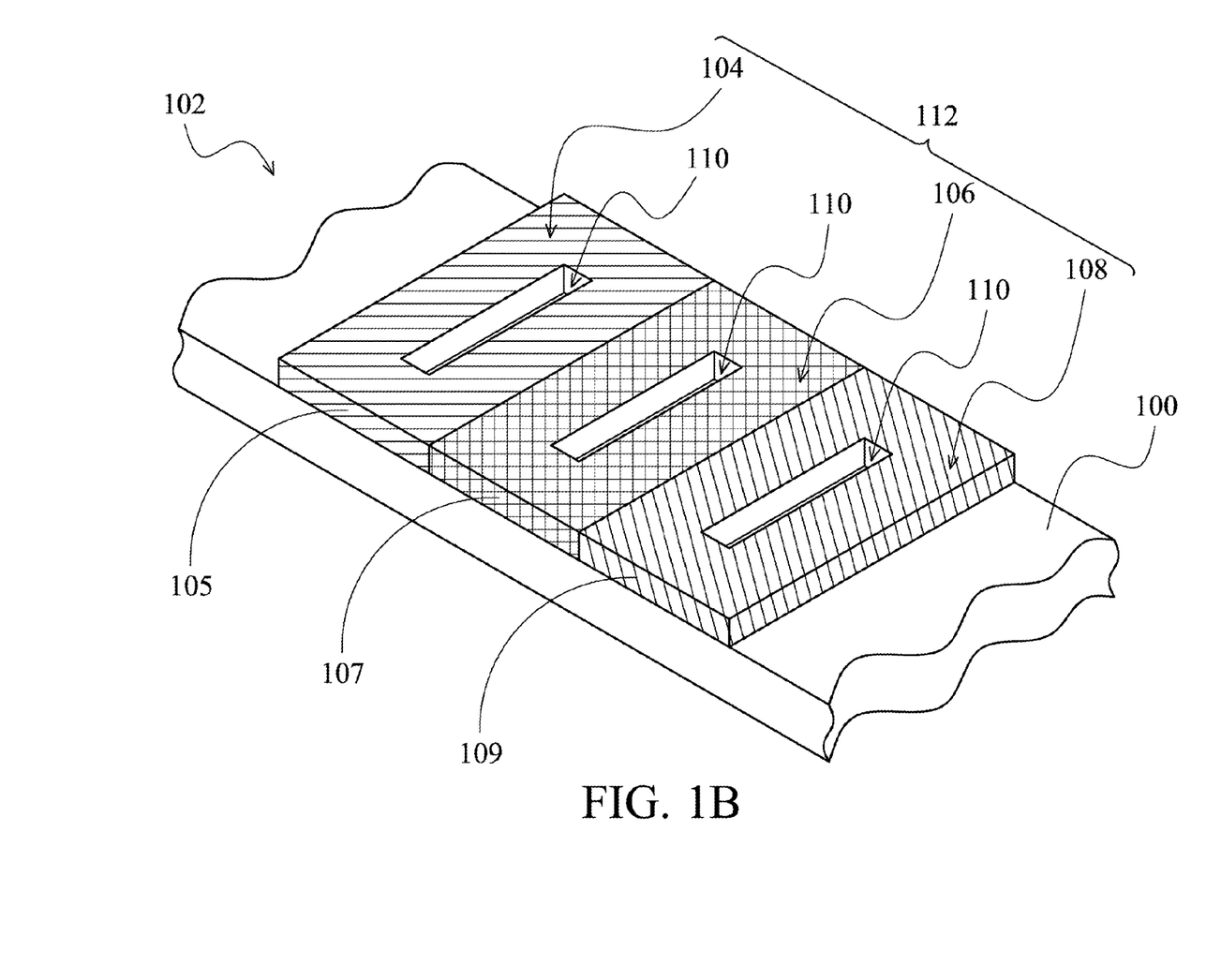
FIG. 1B shows a cross section of a color filter of a liquid crystal on silicon (LCOS) display device of an embodiment of the invention.

FIG. 1A shows a plan view of a color filter 102 of a liquid crystal on silicon (LCOS) display device of an embodiment of the invention. FIG. 1B shows a cross section of a color filter 102 of a liquid crystal on silicon (LCOS) display device of an embodiment of the invention. It is noted that FIGS. 1A and 1B only show one pixel region 112 for simplicity, and the color filter 102 can comprise a plurality of arranged pixel regions 112. Referring to FIGS. 1A and 1B, a color filter 102 is provided, wherein a pixel region 112 of the color filter 102 comprises a first color dot 104, a second color dot 106 and a third color dot 108 on a substrate 100, made of material such as silicon. Many other active or passive devices, elements or layers may be formed on the substrate 100. However, these devices, elements or layers are not shown for simplicity. In an embodiment, the first color is red, the second color is green and the third color is blue. Furthermore, the first, second and third color dots 104, 106, 108 comprise a first color resist 105, a second color resist 107 and a third color resist 109, respectively. In an important feature of the embodiment, each of the first color resist 105, the second color resist 107 and the third color resist 109 in the first, second and third color dots 104, 106, 108 comprises an opening 110, and transmittance of the color filter 102 of the embodiment can be increased due to the openings 110 in the dots. The openings 110 can be regarded as slits, wherein light passes the color filter 102 to generate diffraction and this diffraction can increase transmittance of the color filter 102. As shown in FIG. 1A, the openings 110 are rectangular shaped in an embodiment of the invention. The invention, however, is not limited thereto. The openings 110 can be circular shaped, cross shaped or other suitable shapes. It is noted that the color filter 102 of a liquid crystal on silicon (LCOS) display device of an embodiment of the invention has higher transmittance than prior art and meets national television standard committee (NTSC) specifications.

Figure 2A:
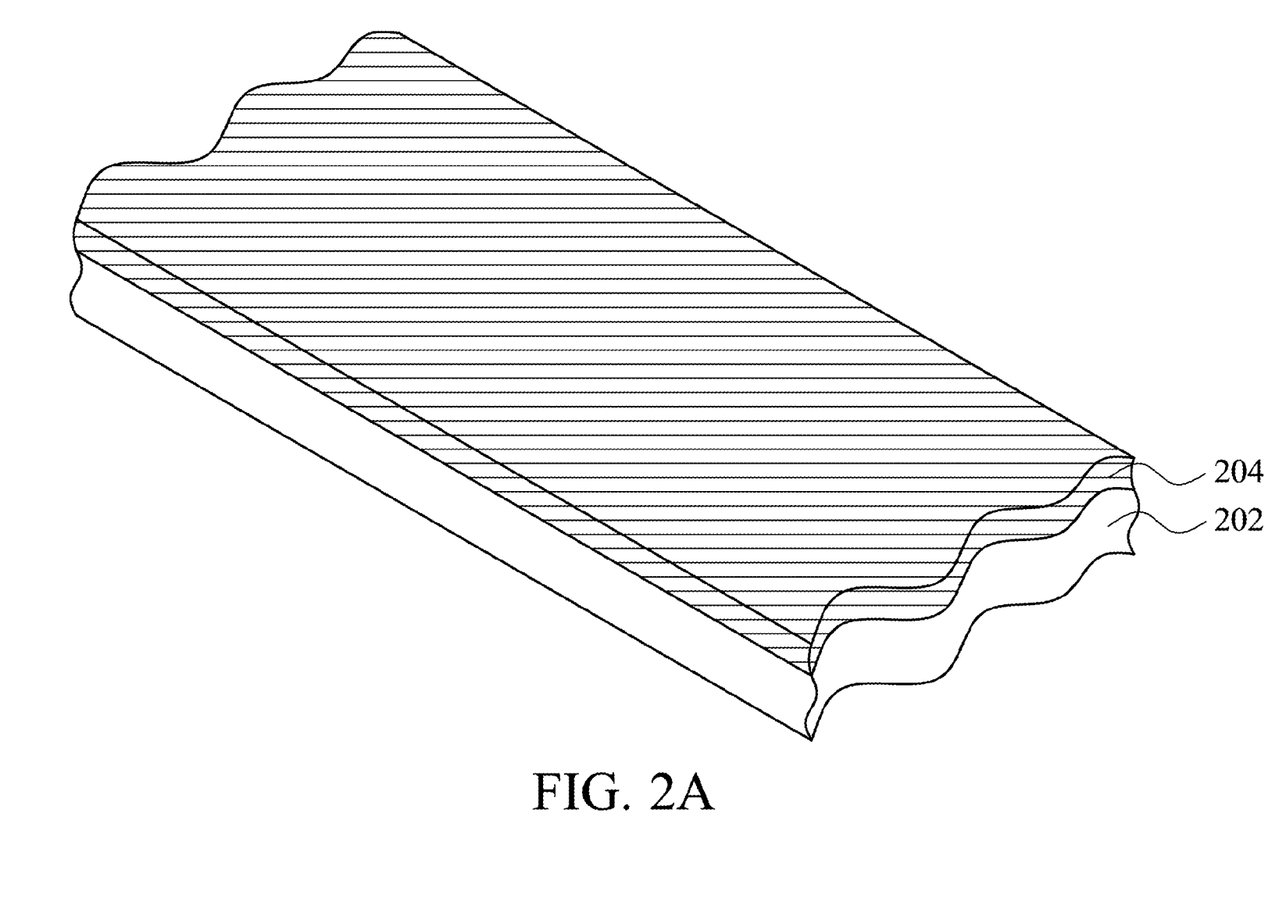
FIGS. 2A~2I show fabrications of a color filter of a liquid crystal on silicon (LCOS) display device of an embodiment of the invention.
Figure 2B:
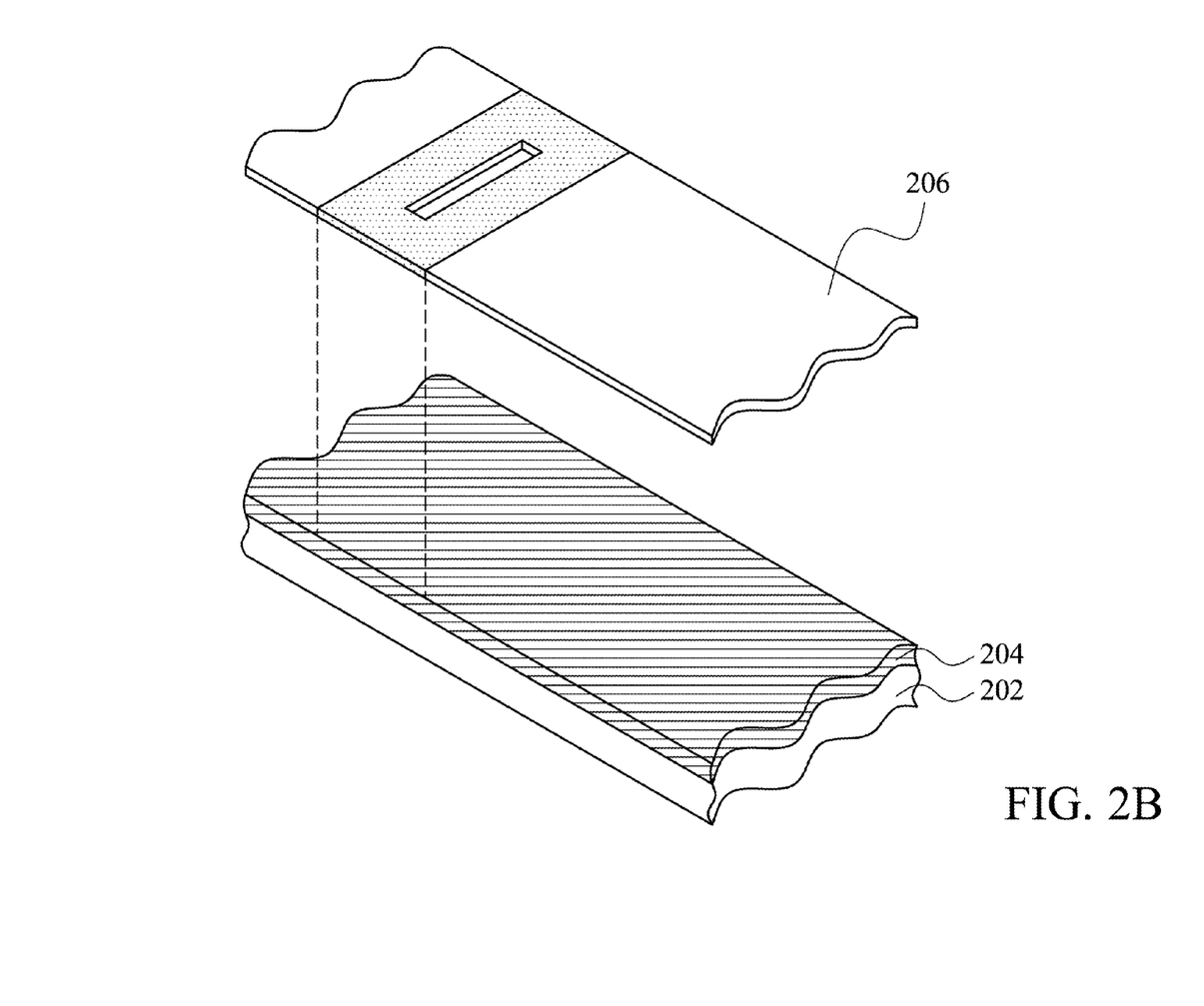
Figure 2C:
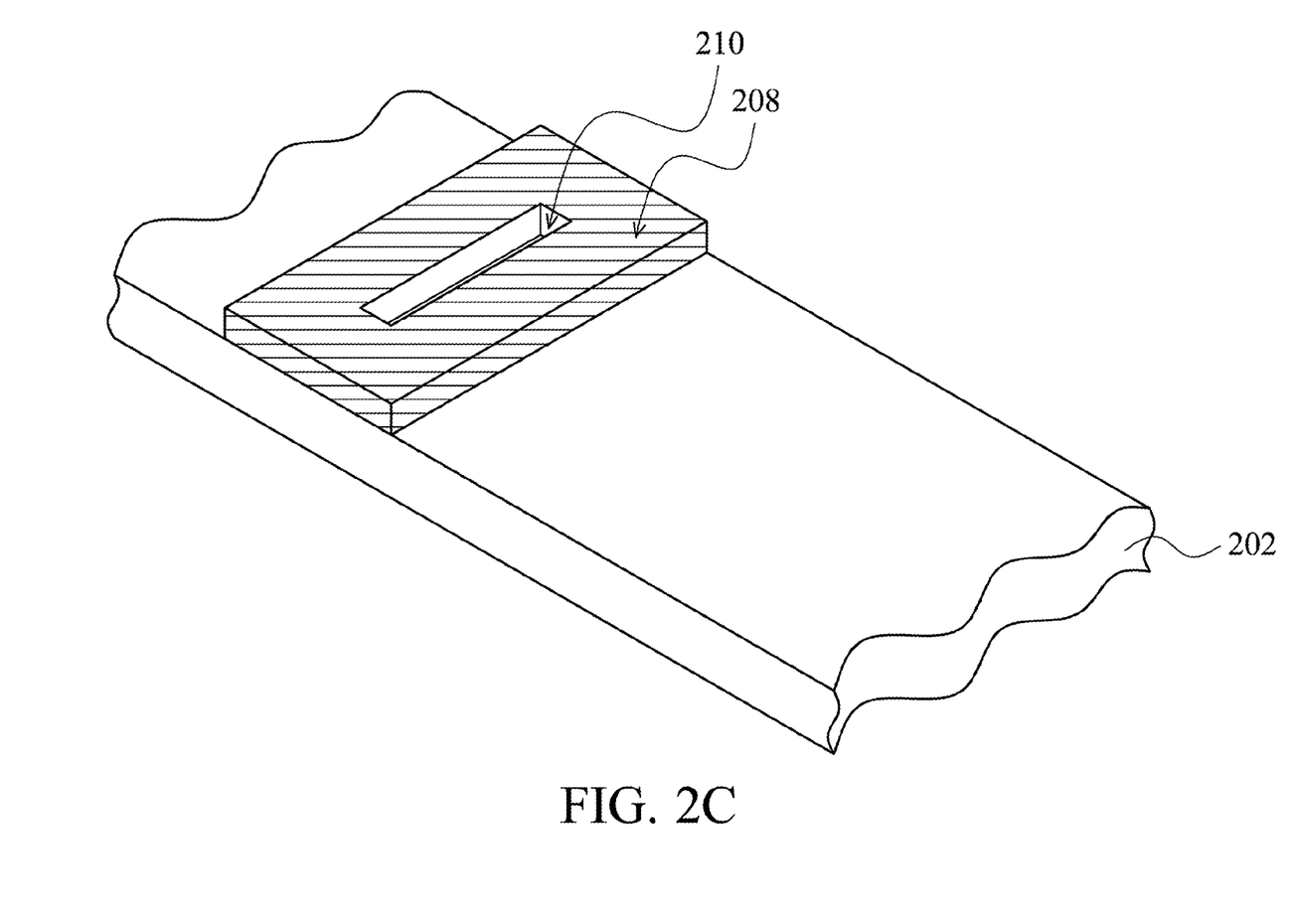
Figure 2D:
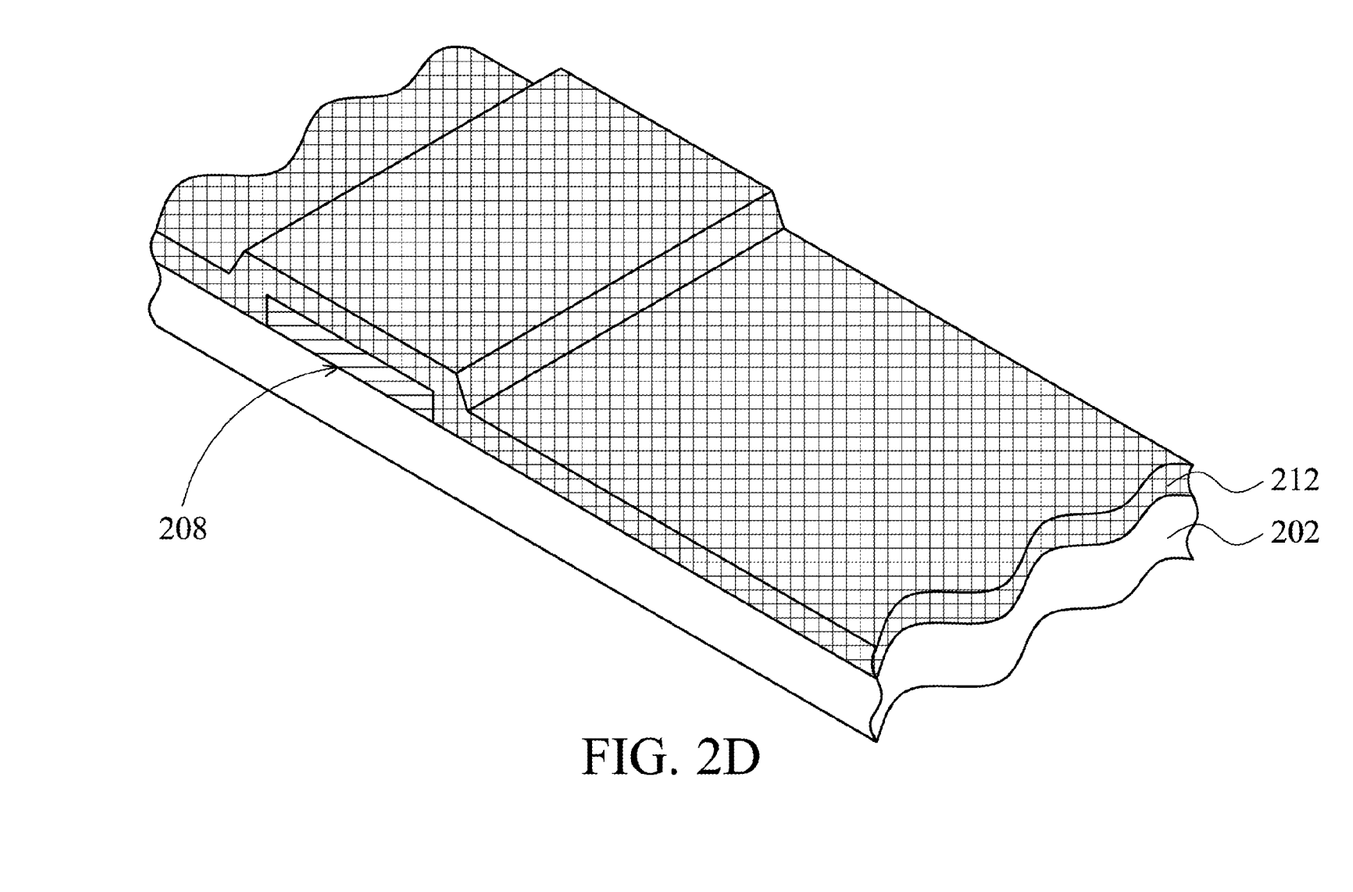
Figure 2E:
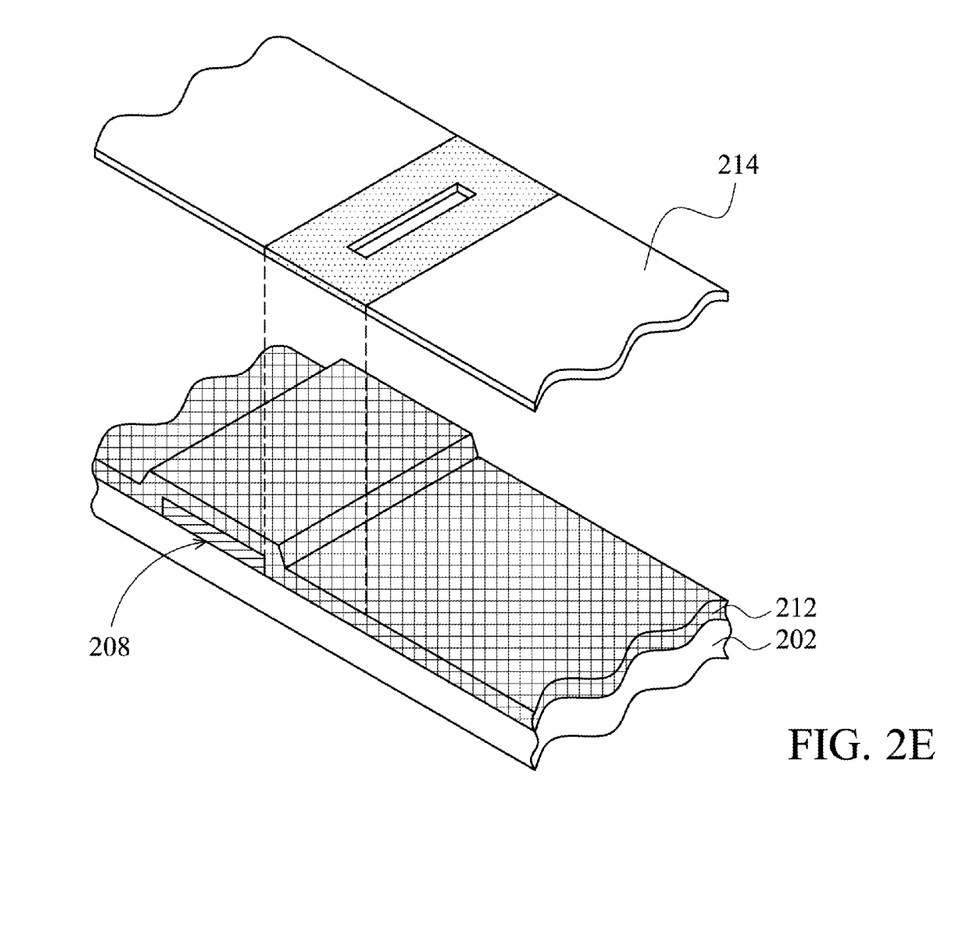
Figure 2F:
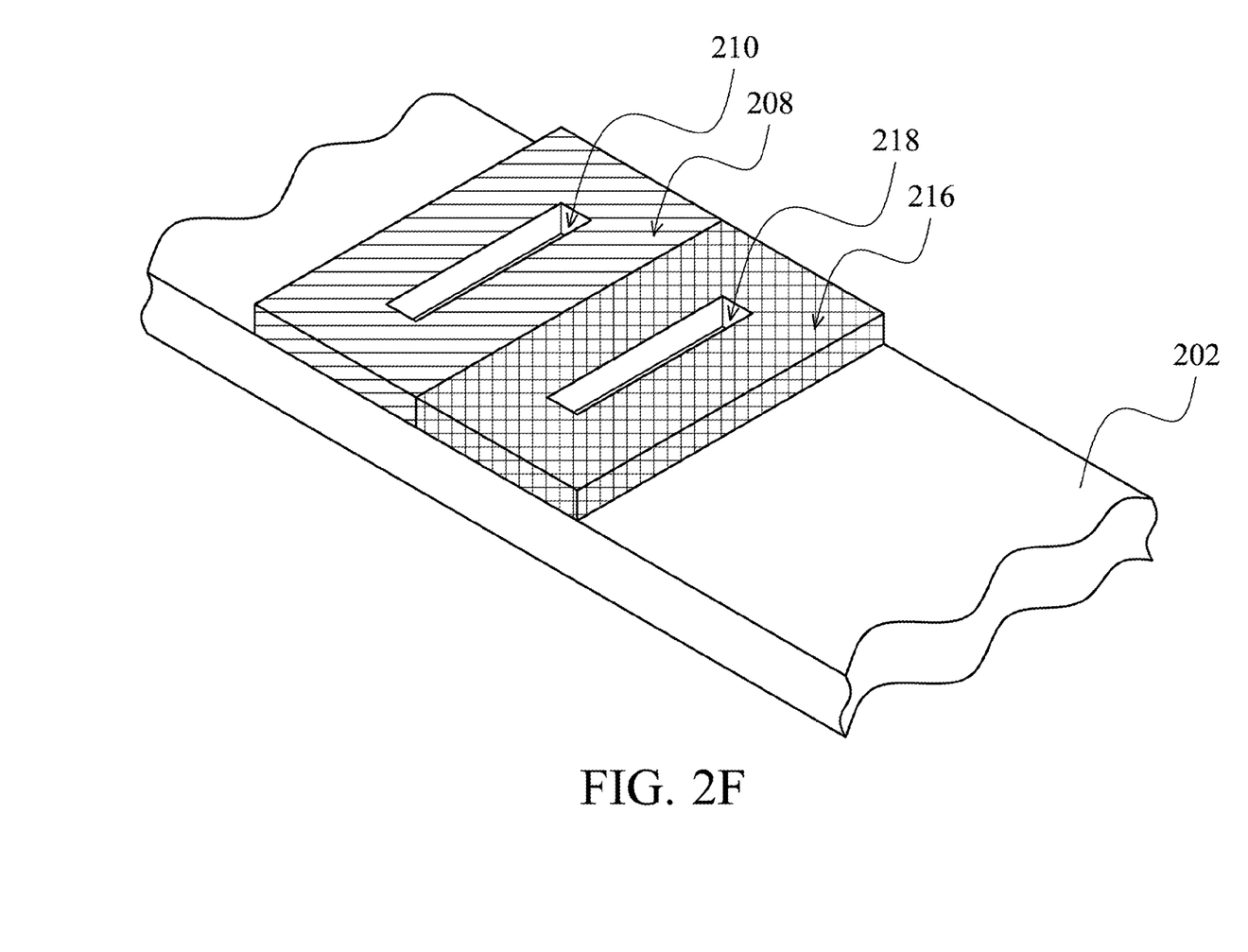
Figure 2G:
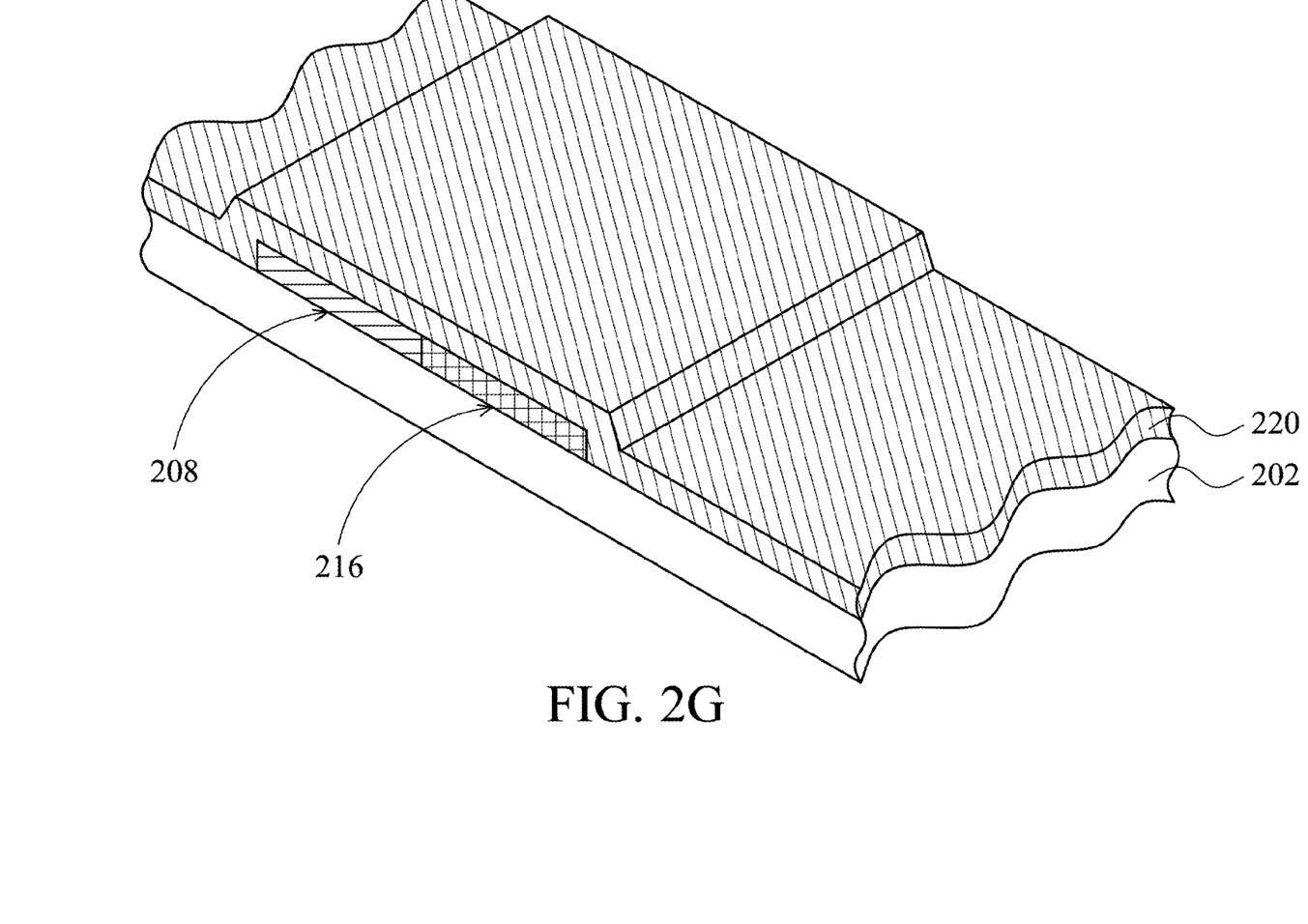
Figure 2H:
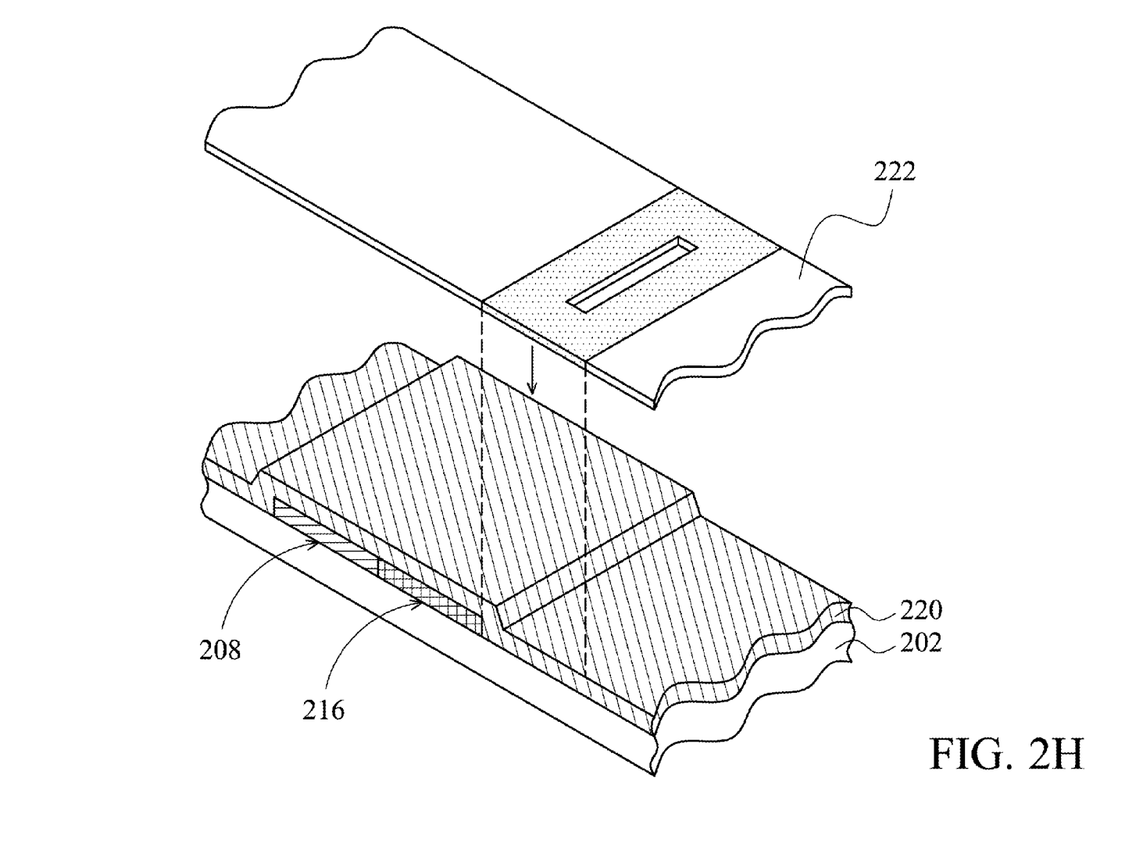
Figure 2I:
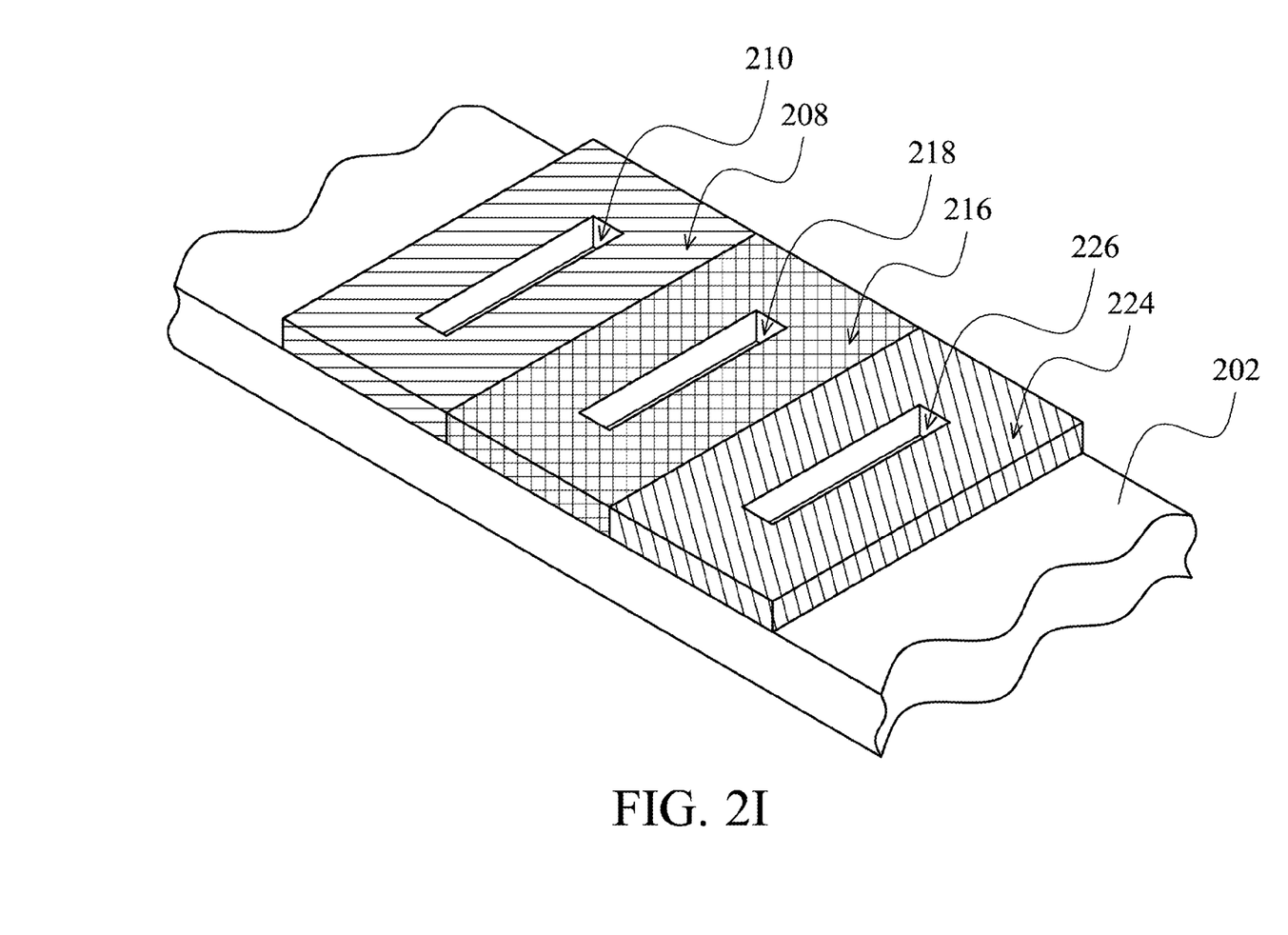

FIGS. 2A~2I show fabrication of a color filter of a liquid crystal on silicon (LCOS) display device of an embodiment of the invention. Referring to FIG. 2A, a substrate 202 is provided. In an embodiment of the invention, the substrate 202 is a semiconductor substrate, made up of material such as silicon. Next, a first color resist 204 is coated on the substrate 202. In an embodiment, the first color is red and the first color resist 204 is a positive resist. Alternatively, the first color can be another color and the first color resist 204 can be a negative resist. Next, referring to FIG. 2B, an exposure step is performed to the first color resist 204 with light passing through a first mask 206. Referring to FIG. 2C, a development step is performed to remove the exposed portions of the first color resist 204 and thus a first color dot 208 comprising an opening 210 is formed. Referring to FIG. 2D, a second color resist 212 is coated on the substrate 202. In an embodiment, the second color is green and the second color resist 212 is a positive resist. Alternatively, the second color can be another color and the second color resist 212 can be a negative resist. Next, referring to FIG. 2E, an exposure step is performed to the second color resist 212 with light passing through a second mask 214. Referring to FIG. 2F, a development step is performed to remove the exposed portions of the second color resist 212, and thus a second color dot 216 comprising an opening 218 is formed neighboring the first color dot 208. Referring to FIG. 2G, a third color resist 220 is coated on the substrate 202. In an embodiment, the third color is blue and the third color resist 220 is a positive resist. Alternatively, the third color can be another color and the third color resist 220 can be a negative resist. Next, referring to FIG. 2H, an exposure step is performed to the third color resist 220 with light passing through a third mask 222. Referring to FIG. 2I, a development step is performed to remove the exposed portions of the third color resist 220, and thus a third color dot 224 comprising an opening 226 is formed neighboring the second color dot 216.

According to the description above, the color filter of a liquid crystal on silicon (LCOS) display device of embodiments of the invention can provide advantages as follows. First, transmittance of the color filter of a liquid crystal on silicon (LCOS) display device provided by an embodiment of the invention can be increased 15%~30% and the LCOS display device meets NTSC specifications. Second, process for fabricating the color filter does not have to be changed, wherein only layout of patterns of the mask for defining the color resists have to be modified for the color dots to comprise openings.

While the invention has been described by way of example and in terms of the preferred embodiments, it is to be understood that the invention is not limited to the disclosed embodiments. It is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A color filter of a liquid crystal on silicon (LCOS) display device, comprising:
    a silicon substrate comprising a plurality of pixel regions wherein each pixel region comprises a first color dot, a second color dot and a third color dot; and
    a first color resist, a second color resist and a third color resist disposed in the first color dot, the second color dot and the third color dot on the substrate, wherein each of the first color resist, the second color resist and the third color resist comprises at least one opening, wherein the openings have a size or are in a shape for light passing the openings generating diffraction to increase transmittance.

2. The color filter as claimed in claim 1, wherein the openings are cross shaped.

3. The color filter as claimed in claim 1, wherein the openings are rectangular shaped.

4. The color filter as claimed in claim 1, wherein the first color is red, the second color is green and the third color is blue.

5. The color filter as claimed in claim 1, wherein transmittance of the color filter is increased 15%~30% due to the openings.

6. The color filter as claimed in claim 1, wherein the liquid crystal on silicon (LCOS) display device meets national television standard committee (NTSC) specifications.

7. A method for forming a color filter of a liquid crystal on silicon (LCOS) display device, comprising the step of:
    providing a substrate, wherein the substrate is a silicon substrate;
    forming a first color resist on the substrate;
    patterning the first color resist to form a first color dot, wherein the first color resist comprises an opening in the first color dot;
    forming a second color resist on the substrate and the first color resist; and
    patterning the second color resist to form a second color dot, wherein the second color resist comprises an opening in the second color dot, wherein each of the openings has a size or is in a shape for light passing the openings generating diffraction to increase transmittance.

8. The method for forming a color filter of a liquid crystal on silicon (LCOS) display device as claimed in claim 7, further comprising:
    forming a third color resist on the substrate and the first and the second color resists; and
    patterning the third color resist to form a third color dot, wherein the third color resist comprises an opening in the third color dot.

9. The method for forming a color filter of a liquid crystal on silicon (LCOS) display device as claimed in claim 8, wherein the first color is red, the second color is green and the third color is blue.

10. The method for forming a color filter of a liquid crystal on silicon (LCOS) display device as claimed in claim 7, wherein patterning the first color resist comprises:
    exposing the first color resist with light passing through a first mask; and
    performing a development step to the first color resist.

11. The method for forming a color filter of a liquid crystal on silicon (LCOS) display device as claimed in claim 7, wherein patterning the second color resist comprises:
    exposing the second color resist with light passing through a second mask; and
    performing a development step to the second color resist.

12. The method for forming a color filter of a liquid crystal on silicon (LCOS) display device as claimed in claim 7, wherein each of the openings is cross shaped.

13. The method for forming a color filter of a liquid crystal on silicon (LCOS) display device as claimed in claim 7, wherein transmittance of the color filter is increased 15%~30% due to the openings.

14. The method for forming a color filter of a liquid crystal on silicon (LCOS) display device as claimed in claim 13, wherein the liquid crystal on silicon (LCOS) display device meets national television standard committee (NTSC) specifications.

15. The method for forming a color filter of a liquid crystal on silicon (LCOS) display device as claimed in claim 7, wherein the openings are rectangular shaped.

* * * * *